United States Patent
Lee et al.

(10) Patent No.: US 10,916,274 B2
(45) Date of Patent: Feb. 9, 2021

(54) POWER MANAGEMENT INTEGRATED CIRCUITS AND SEMICONDUCTOR MEMORY MODULES INCLUDING POWER MANAGEMENT INTEGRATED CIRCUITS

(71) Applicant: Samsung Electronics Co., Ltd., Suwon-si (KR)

(72) Inventors: Jong-Geon Lee, Seoul (KR); Kyudong Lee, Seoul (KR); Jinseong Yun, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/731,908

(22) Filed: Dec. 31, 2019

(65) Prior Publication Data

US 2020/0335141 A1    Oct. 22, 2020

(30) Foreign Application Priority Data

Apr. 19, 2019   (KR) .................. 10-2019-0045922
Aug. 27, 2019   (KR) .................. 10-2019-0104965

(51) Int. Cl.
*G11C 5/14*     (2006.01)
*G11C 5/04*     (2006.01)
*G06F 1/3234*   (2019.01)
*G06F 1/3225*   (2019.01)

(52) U.S. Cl.
CPC ............ *G11C 5/147* (2013.01); *G06F 1/3225* (2013.01); *G06F 1/3275* (2013.01); *G11C 5/04* (2013.01)

(58) Field of Classification Search
CPC .......... G11C 5/147; G11C 5/14; G11C 5/4074

USPC ........................................................ 365/226
See application file for complete search history.

(56) References Cited

U.S. PATENT DOCUMENTS

| | | | |
|---|---|---|---|
| 8,484,496 B2 | 7/2013 | Anderson et al. | |
| 8,601,302 B2 | 12/2013 | Lachwani et al. | |
| 9,541,992 B2 | 1/2017 | Lee et al. | |
| 9,720,472 B2 | 8/2017 | Park et al. | |
| 9,746,894 B1 | 8/2017 | Rajagopalan | |
| 9,841,805 B2 | 12/2017 | Shimada | |
| 10,067,595 B2 | 9/2018 | Jeong et al. | |
| 10,242,198 B2 | 3/2019 | Harrison | |
| 10,242,973 B2 | 3/2019 | Baek et al. | |
| 2010/0250974 A1 | 9/2010 | Ristic et al. | |
| 2016/0189754 A1* | 6/2016 | Zhang | G11C 5/06 365/51 |

(Continued)

FOREIGN PATENT DOCUMENTS

| | | |
|---|---|---|
| JP | 2010529548 | 8/2010 |
| KR | 101618732 | 5/2016 |

*Primary Examiner* — Jason Lappas
(74) *Attorney, Agent, or Firm* — Myers Bigel, P.A.

(57) ABSTRACT

A power management integrated circuit includes first pads, second pads, a third pad, and a fourth pad that are configured to be connected with an external device, a regulation block that receives first voltages from the first pads, converts the first voltages to second voltages, and outputs the second voltages to the second pads, a communication block that receives a command through the third pad and outputs an internal information request received together with the command responsive to the command, and a logic block that controls an operation of the regulation block, receives the internal information request from the communication block, and outputs internal state information to the fourth pad based on the internal information request.

20 Claims, 10 Drawing Sheets

(56) References Cited

U.S. PATENT DOCUMENTS

2016/0357245 A1  12/2016  Heo et al.
2018/0321313 A1  11/2018  Troy et al.

* cited by examiner

POWER MANAGEMENT INTEGRATED CIRCUITS AND SEMICONDUCTOR MEMORY MODULES INCLUDING POWER MANAGEMENT INTEGRATED CIRCUITS

CROSS-REFERENCE TO RELATED APPLICATIONS

This application claims priority under 35 U.S.C. § 119 to Korean Patent Application No. 10-2019-0045922, filed on Apr. 19, 2019, and Korean Patent Application No. 10-2019-0104965, filed on Aug. 27, 2019, in the Korean Intellectual Property Office, the disclosures of which are incorporated by reference herein in their entireties.

BACKGROUND

Embodiments of the inventive concepts described herein relate to semiconductor circuits, and more particularly, relate to power management integrated circuits providing a mechanism useful for debugging by outputting an internal parameter externally to the power management integrated circuit and semiconductor memory modules including such a power management integrated circuit.

A power management integrated circuit (PMIC) that reduces power consumption by adjusting levels of voltages and power consumption is being developed based on an increasing demand for lower power consumption in such devices. Many computing devices that are recently manufactured are designed such that the power management integrated circuit is mounted thereon.

A dual in-line memory module (DIMM) may be used as a main memory in computing devices. As various volatile memories and/or nonvolatile memories may be mounted on the DIMM, the DIMM may provide a storage space for a main memory to a computing device.

A double data rate 5 (DDR5) synchronous dynamic random access memory (SDRAM) is being developed as part of a dynamic random access memory (DRAM) family. A DIMM for the DDR5 SDRAM is being developed for the purpose of corresponding with a characteristic of the DDR5 SDRAM and supporting functions of the DDR5 SDRAM. The DIMM for the DDR5 SDRAM is being designed such that the power management integrated circuit may be mounted thereon.

The sales of the DIMM are overwhelmingly more than the sales of the computing device. Accordingly, the sales of the PMIC for the DIMM are overwhelmingly more than the sales of the PMIC for the computing device. In the case where the PMIC is mounted on the DIMM, the debugging for correcting an error of the PMIC of the DIMM gives a considerable load to DIMM manufacturers.

SUMMARY

Embodiments of the inventive concepts provide power management integrated circuits that provide a circuit that is useful for debugging and semiconductor memory modules including the power management integrated circuit.

According to an example embodiment of the inventive concepts, a power management integrated circuit includes first pads, second pads, a third pad, and a fourth pad that are configured to be connected with an external device, a regulation block that is configured to receive first voltages from the first pads, to convert the first voltages to second voltages, and to output the second voltages to the second pads, a communication block that is configured to receive a command through the third pad and to output an internal information request received together with the command responsive to the command, and a logic block that is configured to control an operation of the regulation block, to receive the internal information request from the communication block, and to output internal state information to the fourth pad based on the internal information request.

According to an example embodiment of the inventive concepts, a semiconductor memory module includes a printed circuit board that includes first connectors, second connectors, and third connectors configured to communicate with an external device, memory devices that are on the printed circuit board and configured to exchange a data signal and a data strobe signal with the external device through the first connectors, a driver that is on the printed circuit board and configured to receive a first command and an address from the external device through the second connectors and to control the memory devices in response to the first command and the address, and a power management integrated circuit that is on the printed circuit board and configured to receive first voltages from the external device through the third connectors, to convert the first voltages to second voltages, and to supply the second voltages to the memory devices and the driver. The power management integrated circuit is further configured to output an internal voltage or current responsive to a second command from the external device.

According to an example embodiment of the inventive concepts, a power management integrated circuit includes a first pad, a second pad, a third pad, a fourth pad, a fifth pad, a sixth pad, a seventh pad, an eighth pad, a ninth pad, a tenth pad, a data pad, and a clock pad that are configured to be connected with an external device, a low drop out (LDO) driver that is configured to receive a first voltage through the first pad, to generate an internal voltage, a second voltage, and a third voltage from the first voltage, and to output the second voltage and the third voltage through the second pad and the third pad, respectively, a regulation block that is configured to receive the internal voltage from the LDO regulator, to operate by using the internal voltage, to receive a fourth voltage from the fourth pad, to generate a fifth voltage, a sixth voltage, a seventh voltage, and an eighth voltage from the fourth voltage, and to output the fifth voltage, the sixth voltage, the seventh voltage, and the eighth voltage through the fifth pad, the sixth pad, the seventh pad, and the eighth pad, respectively, a communication block that is configured to communicate data through the data pad, to receive a clock signal through the clock pad, and to output a selection code transferred through the data pad responsive to the data having a particular pattern, and a logic block that is configured to control the regulation block and to output a signal indicating a state of the regulation block through the ninth pad. Responsive to receiving the selection code from the communication block, the logic block is further configured to output through the tenth pad a voltage or current corresponding to the selection code from among internally used voltages or currents.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, embodiments of the inventive concepts may be described in detail and clearly to such an extent that one of ordinary skill in the art may implement the inventive concepts. Like numbers refer to like elements throughout.

Figure 1:
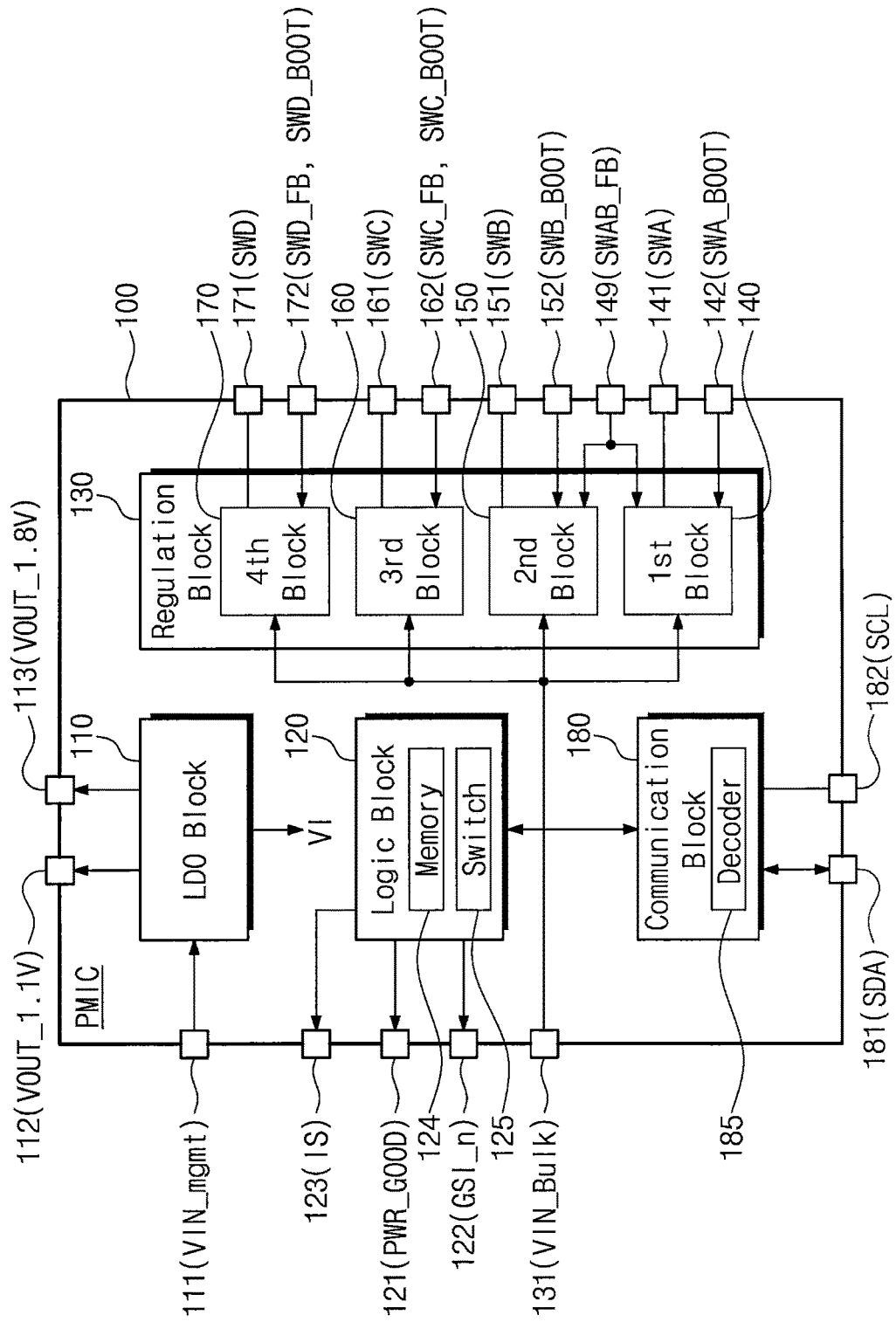
FIG. 1 is a block diagram illustrating a power management integrated circuit according to an embodiment of the inventive concepts.

FIG. 1 is a block diagram illustrating a power management integrated circuit (PMIC) 100 according to an embodiment of the inventive concepts. Referring to FIG. 1, the power management integrated circuit 100 may include a low drop out (LDO) block 110, a logic block 120, a regulation block 130, and a communication block 180.

The LDO block 110 may be connected with a first LDO pad 111, a second LDO pad 112, and a third LDO pad 113 that may be attachable to an external device. The LDO block 110 may receive a first input voltage VIN_mgmt through the first LDO pad 111. For example, a target level of the first input voltage VIN_mgmt may be 3.3 V and may have an allowable range of 3.0 V to 3.6 V.

The LDO block 110 may generate an internal voltage VI from the first input voltage VIN_mgmt. The internal voltage VI may have, for example, 1.1 V, 1.8 V, 3.3 V, or a target level similar to the listed levels. The internal voltage VI may be provided to components of the power management integrated circuit 100, that is, to the logic block 120, the regulation block 130, and/or the communication block 180 as an operating voltage. As used herein, the term "and/or" includes any and all combinations of one or more of the associated listed items. To prevent FIG. 1 from being unnecessarily complicated, paths where the internal voltage VI is supplied to components of the power management integrated circuit 100 are omitted.

The LDO block 110 may generate a first output voltage VOUT_1.1V and a second output voltage VOUT_1.8V from the first input voltage VIN_mgmt. The LDO block 110 may output the first output voltage VOUT_1.1V through the second LDO pad 112 and may output the second output voltage VOUT_1.8V through the third LDO pad 113. For example, a target level of the first output voltage VOUT_1.1V may be 1.1 V, and a target level of the second output voltage VOUT_1.8V may be 1.8 V.

The logic block 120 may operate by using the internal voltage VI provided from the LDO block 110. The logic block 120 may control operations of the power management integrated circuit 100. The logic block 120 may regulate levels of voltages that the regulation block 130 outputs. The logic block 120 may communicate with the external device through the communication block 180.

The logic block 120 may include a first logic pad 121, a second logic pad 122, and a third logic pad 123 (or third logic pads 123) that are attachable to the external device. The logic block 120 may output a state signal PWR_GOOD through the first logic pad 121. The state signal PWR_GOOD may notify information about a state of the power management integrated circuit 100. The state signal PWR_GOOD may be an active high signal that is at an active state when the state signal PWR_GOOD is at a high level.

The logic block 120 may output a general-purpose state interrupt signal GSI_n through the second logic pad 122. The logic block 120 may output internal state information IS through the third logic pad 123 or the third logic pads 123. For example, the internal state information IS may include a voltage or a current that is used in the logic block 120 or a voltage or a current of a particular node in the logic block 120.

The logic block 120 may include a memory 124 and a switch 125. The logic block 120 may store various information, which may be used to control the power management integrated circuit 100, in the memory 124 and may refer to the memory 124. When an internal information request is received through the communication block 180, the switch 125 may output a voltage or a current used (or generated) in the logic block 120 or a voltage or a current of a particular node in the logic block 120 as the internal state information IS.

For example, the switch 125 may output a multi-time program or programmable (MTP) voltage used in the memory 124 or a one-time program or programmable (OTP) voltage used in the memory 124 as the internal state information IS.

The multi-time program (MTP) voltage may be a voltage that is used to program memory cells where two or more program operations are allowed. The one-time program (OTP) voltage may be a voltage that is used to program memory cells where only one program operation is allowed.

For example, the one-time program (OTP) voltage may be used for a nonvolatile memory device such as a read only memory (ROM), an electrically programmable ROM (EPROM), an electrically erasable and programmable ROM (EEPROM), a flash memory, an electrical fuse, a phase-change memory, a ferroelectric memory, a magnetic memory, and/or a resistive memory. The multi-time program (MTP) voltage may also be used for a volatile memory, such as an SRAM and/or a DRAM, as well as a nonvolatile memory.

The power management integrated circuit 100 according to an embodiment of the inventive concepts may output the internal state information IS of the logic block 120 through the third logic pad 123. Accordingly, the power management integrated circuit 100 may provide a mechanism that is useful for debugging and may reduce resources necessary to detect and correct an abnormal operation of the power management integrated circuit 100.

FIG. 1 illustrates an example in which the memory 124 is included in the logic block 120. However, the memory 124 may be disposed outside the logic block 120 and may be configured to communicate with the logic block 120.

Continuing to refer to FIG. 1, the regulation block 130 may operate by using the internal voltage VI received from the LDO block 110. The regulation block 130 may be connected to first regulation pads 131 configured to communicate with the external device. The regulation block 130 may receive a second input voltage VIN_Bulk through the first regulation pads 131.

In a normal mode, the second input voltage VIN_Bulk may have a target level of 12 V and may have an allowable range of 10.2 V to 13.8 V. In a low-power mode and/or a catastrophic mode, the second input voltage VIN_Bulk may have a target level of 5 V and may have an allowable range of 4.25 V to 13.8 V.

The regulation block 130 may include first to fourth blocks 140, 150, 160, 170. The first to fourth blocks 140, 150, 160, 170 may generate first to fourth switching voltages SWA, SWB, SWC, and SWD, respectively, from the second input voltage VIN_Bulk.

The first block 140 may be further connected with a second regulation pad 141, a third regulation pad 142, and a fourth regulation pad 149 (or fourth regulation pads 149) that are attachable to the external device. The first block 140 may generate the first switching voltage SWA from the second input voltage VIN_Bulk and may output the first switching voltage SWA through the second regulation pad 141.

The first switching voltage SWA may have a target level of 1.1 V and may have an allowable error range of, for example, 2.5%. The first block 140 may receive a first boot voltage SWA_BOOT through the third regulation pad 142 and may receive the first feedback voltage SWAB_FB through the fourth regulation pad 149. The first block 140 may maintain the first switching voltage SWA (or a first output voltage at a node of a first passive element (e.g., including a capacitor and/or an inductor) having another node receiving the first switching voltage SWA, the first output voltage may being the first feedback voltage SWAB_FB) at a target level by using the first boot voltage SWA_BOOT and the first feedback voltage SWAB_FB.

The second block 150 may be further connected with the fourth regulation pad 149, a fifth regulation pad 151, and a sixth regulation pad 152 that are attachable to the external device. The second block 150 may generate the second switching voltage SWB from the second input voltage VIN_Bulk and may output the second switching voltage SWB through the fifth regulation pad 151.

The second switching voltage SWB may have a target level of 1.1 V and may have an allowable error range of, for example, 2.5%. The second block 150 may receive a second boot voltage SWB_BOOT through the sixth regulation pad 152 and may receive the second feedback voltage SWAB_FB through the fourth regulation pad 149. For the coherency of reference numerals, the term "second feedback voltage SWAB_FB" may be used, but the second feedback voltage SWAB_FB may be identical to the first feedback voltage SWAB_FB (e.g., as a common signal). The second block 150 may maintain the second switching voltage SWB (or a second output voltage at a node of a second passive element (e.g., including a capacitor and/or an inductor) having another node receiving the second switching voltage SWB, the second output voltage may being the second feedback voltage SWAB_FB) at a target level by using the second boot voltage SWB_BOOT and the second feedback voltage SWAB_FB.

The third block 160 may be further connected with a seventh regulation pad 161 and eighth regulation pads 162 that are attachable to the external device. The third block 160 may generate the third switching voltage SWC from the second input voltage VIN_Bulk and may output the third switching voltage SWC through the seventh regulation pad 161.

The third switching voltage SWC may have a target level of 1.1 V and may have an allowable error range of, for example, 2.5%. The third block 160 may receive a third boot voltage SWC_BOOT and a third feedback voltage SWC_FB through the eighth regulation pad 162. The third block 160 may maintain the third switching voltage SWC (or a third output voltage at a node of a third passive element (e.g., including a capacitor and/or an inductor) having another node receiving the third switching voltage SWC, the third output voltage may being the third feedback voltage SWC_FB) at a target level by using the third boot voltage SWC_BOOT and the third feedback voltage SWC_FB.

The fourth block 170 may be further connected with a ninth regulation pad 171 and a tenth regulation pad 172 that are attachable to the external device. The fourth block 170 may generate the fourth switching voltage SWD from the second input voltage VIN_Bulk and may output the fourth switching voltage SWD through the ninth regulation pad 171.

The fourth switching voltage SWD may have a target level of 1.8 V and may have an allowable error range of, for example, 2.5%. The fourth block 170 may receive a fourth boot voltage SWD_BOOT and a fourth feedback voltage SWD_FB through the tenth regulation pad 172. The fourth block 170 may maintain the fourth switching voltage SWD (or a fourth output voltage at a node of a fourth passive element (e.g., including a capacitor and/or an inductor) having another node receiving the fourth switching voltage SWD, the fourth output voltage may being the fourth feedback voltage SWD_FB) at a target level by using the fourth boot voltage SWD_BOOT and the fourth feedback voltage SWD_FB.

The communication block 180 may operate by using the internal voltage VI provided from the LDO block 110. The communication block 180 may include a first communication pad 181 (or a data pad) and a second communication pad 182 (or a clock pad) that are attachable to the external device. The communication block 180 may exchange a data signal SDA through the first communication pad 181 and may receive a clock signal SCL through the second communication pad 182.

The communication block 180 may latch the data signal SDA in synchronization with the clock signal SCL. The communication block 180 may include a decoder 185 configured to decode a command included in the data signal SDA. For example, the decoder 185 may decode the data signal SDA in compliance with the Inter-Integrated Circuit (I2C) and/or Improved Inter-Integrated Circuit (I3C) protocol and may communicate with the external device, though the inventive concepts are not limited thereto.

In embodiments and/or situations in which the data signal SDA does not correspond with the I2C and/or I3C protocol, when the data signal SDA corresponds with a particular command (or condition or pattern) that is predefined by a manufacturer of the power management integrated circuit 100, for example, with a vendor command, the decoder 185 may operate in response to the particular command. For example, the decoder 185 may transfer information extracted from the data signal SDA following the particular command to the logic block 120 as an internal information request.

For example, the communication block 180 may provide the logic block 120 with information about a kind of the internal state information IS that the logic block 120 will output through the third logic pads 123, or a kind of a pad, through which the internal state information IS will be output, from among the third logic pads 123.

In embodiments and/or situations in which the data signal SDA does not correspond with the I2C and/or I3C protocol and does not correspond with the vendor command, the decoder 185 or the communication block 180 may ignore the data signal SDA.

An example is described with reference to FIG. 1 as the power management integrated circuit 100 exchanges various signals with the external device through various pads. However, the pads of the power management integrated circuit 100 and signals exchanged with the external device are not limited to the example illustrated in FIG. 1 and described with reference to FIG. 1. For example, more pads and signals than those described with reference to FIG. 1 will be described with reference to FIG. 4. In some embodiments, elements illustrated as a single pad may include a plurality of pads.

Figure 2:
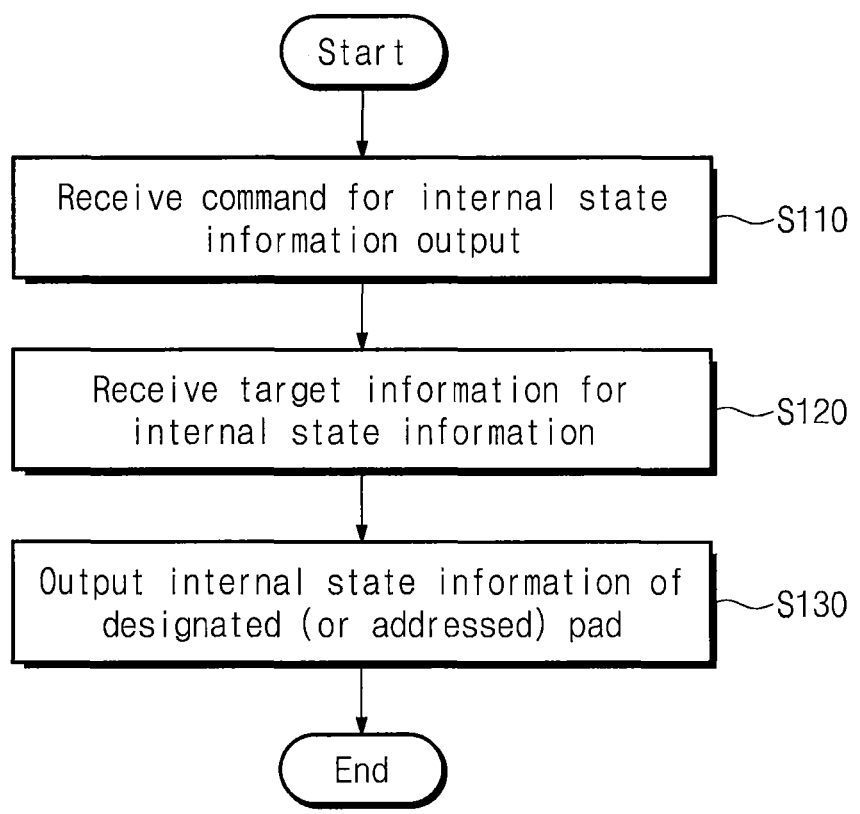
FIG. 2 is a flowchart illustrating an operating method of a power management integrated circuit according to an embodiment of the inventive concepts.

FIG. 2 is a flowchart illustrating an operating method of the power management integrated circuit 100 according to an embodiment of the inventive concepts. Referring to FIGS. 1 and 2, in operation S110, the power management integrated circuit 100 may receive a command for outputting the internal state information IS. For example, the communication block 180 of the power management integrated circuit 100 may receive a vendor command through the first communication pad 181 and the second communication pad 182 that are designated to be used for the communication complying with the I2C and/or I3C protocol.

In operation S120, the power management integrated circuit 100 may receive target information of the internal state information IS. For example, the power management integrated circuit 100 may receive target information selected for an output from among a plurality of internal state information as the internal information request. In operation S130, the power management integrated circuit 100 may output the target internal state information IS through a designated pad or through a pad identified by an address received together with the target information.

For example, the power management integrated circuit 100 may receive the vendor command from a test device such as advanced test equipment (ATE) or a computer. The test device may provide information about a cause of an abnormal operation of the power management integrated circuit 100 by testing the internal state information IS output from the power management integrated circuit 100.

The power management integrated circuit 100 according to an embodiment of the inventive concepts may be configured to receive the vendor command, which is not associated with and/or defined by the I2C and/or I3C protocol, from the first and second communication pads 181 and 182 designated to be used in compliance with the I2C and/or I3C protocol. The power management integrated circuit 100 may output the internal state information IS to the third logic pads 123 depending on the vendor command. Accordingly, the power management integrated circuit 100 may provide a mechanism that is useful for debugging and may reduce the amount of resources (e.g., a time and costs) necessary to correct an abnormal operation of the power management integrated circuit 100.

Figure 3:
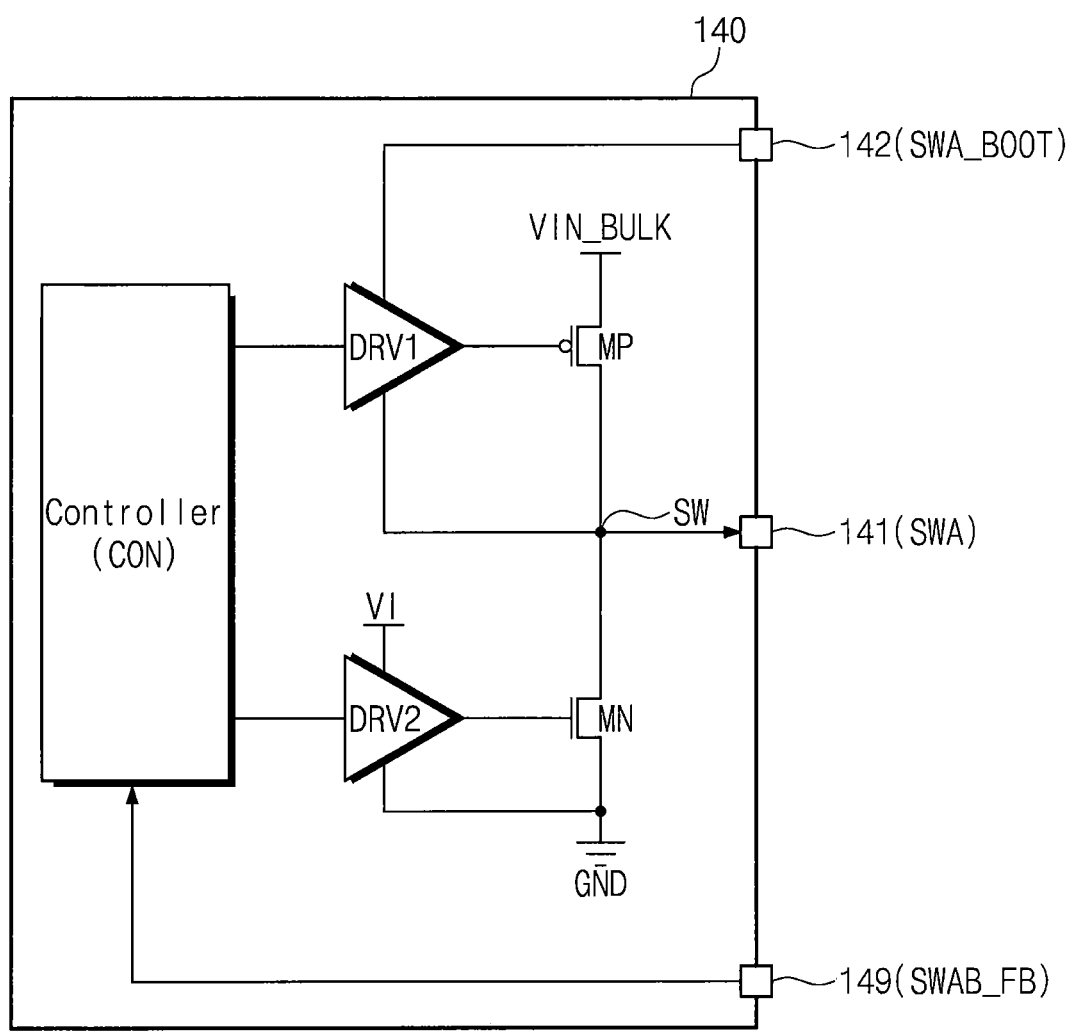
FIG. 3 illustrates an example of a first block of a power management integrated circuit according to an embodiment of the inventive concepts.

FIG. 3 illustrates an example of the first block 140 of the power management integrated circuit 100 according to an embodiment of the inventive concepts. Referring to FIG. 3, the first block 140 of the regulation block 130 may include a first transistor MP, a second transistor MN, a first driver DRV1, a second driver DRV2, and a controller CON.

The first transistor MP may be connected between a node to which the second input voltage VIN_Bulk is supplied and a switch node SW. The first transistor MP may operate in response to an output of the first driver DRV1. The first transistor MP may increase a voltage of the switch node SW.

The second transistor MN may be connected between the switch node SW and a ground node to which a ground voltage GND is supplied. The second transistor MN may operate in response to an output of the second driver DRV2. The second transistor MN may decrease a voltage of the switch node SW.

A voltage of the switch node SW may be output through the second regulation pad 141 as the first switching voltage SWA. The first driver DRV1 may receive the first boot voltage SWA_BOOT through the third regulation pad 142 and may receive the first switching voltage SWA from the switch node SW. The first driver DRV1 may operate in a voltage domain that is defined by the first boot voltage SWA_BOOT and the first switching voltage SWA. The first driver DRV1 may turn on or turn off the first transistor MP under control of the controller CON.

The second driver DRV2 may operate in a voltage domain that is defined by the internal voltage VI and the ground voltage GND. The second driver DRV2 may turn on or turn off the second transistor MN under control of the controller CON.

The controller CON may receive the first feedback voltage SWAB_FB through the fourth regulation pad 149 (or the fourth regulation pads 149). The controller CON may alternately turn on the first transistor MP and the second transistor MN depending on the first feedback voltage SWAB_FB.

When the first feedback voltage SWAB_FB is lower than a target level, the controller CON may increase a time when the first transistor MP is turned on and may decrease a time when the second transistor MN is turned on (e.g., by controlling the first driver DRV1 and/or the second driver DRV2). When the first feedback voltage SWAB_FB is higher than the target level, the controller CON may decrease a time when the first transistor MP is turned on and may increase a time when the second transistor MN is turned on (e.g., by controlling the first driver DRV1 and/or the second driver DRV2).

Structures and operations of the second block 150, the third block 160, and/or the fourth block 170 may be identical to those of the first block 140 except that the second switching voltage SWB, the third switching voltage SWC, and/or the fourth switching voltage SWD may be used instead of the first switching voltage SWA, the second boot voltage SWB_BOOT, the third boot voltage SWC_BOOT, and/or the fourth boot voltage SWD_BOOT may be used instead of the first boot voltage SWA_BOOT, and the second feedback voltage SWAB_FB, the third feedback voltage SWC_FB, and/or the fourth feedback voltage SWD_FB may be used as the first feedback voltage SWAB_FB. Thus, additional description will be omitted to avoid redundancy.

Figure 4:
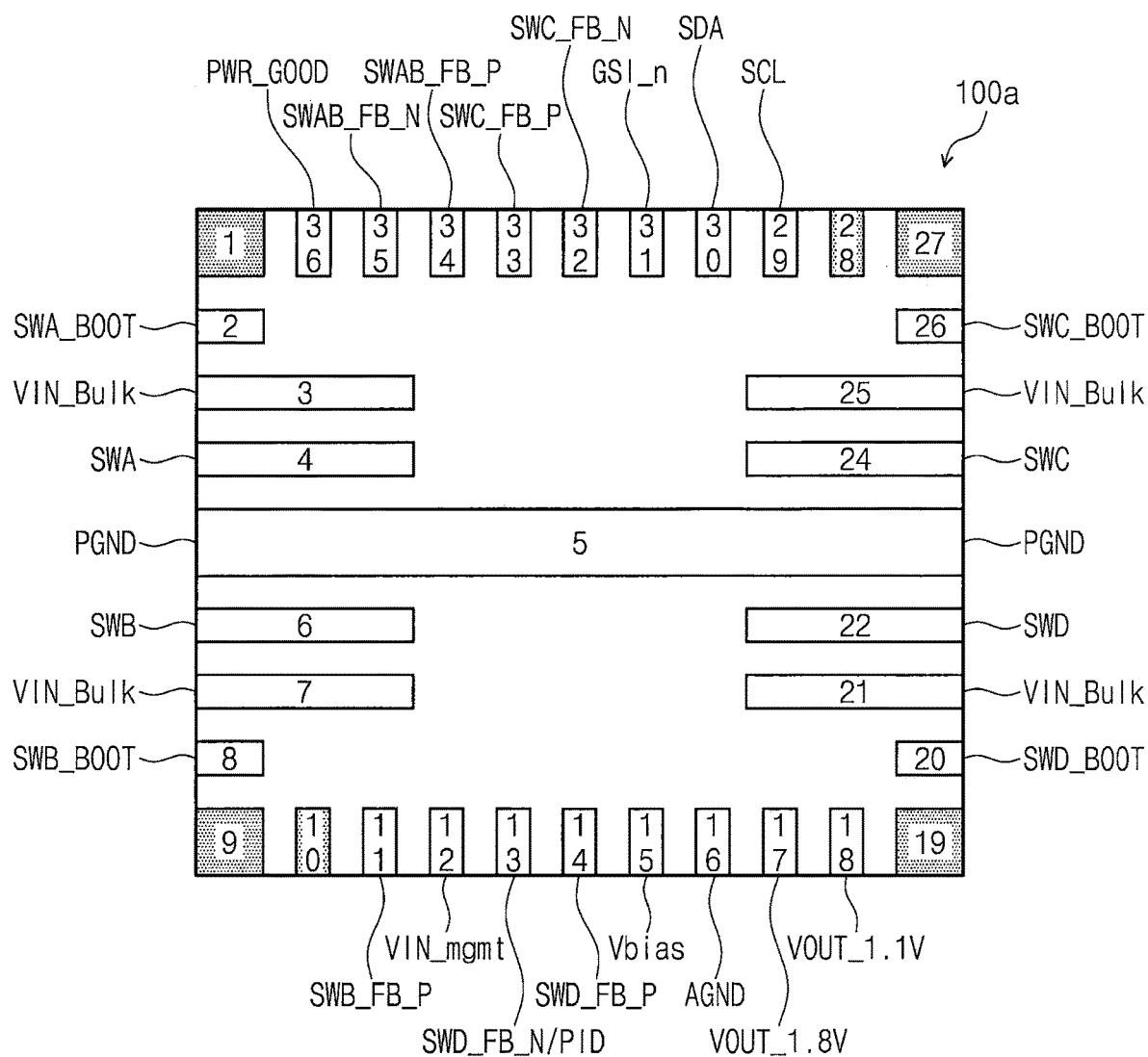
FIG. 4 illustrates an example pad layout of the power management integrated circuit of FIG. 1.

FIG. 4 illustrates an example pad layout 100a of the power management integrated circuit 100 of FIG. 1. Referring to FIGS. 1 and 4, the pad layout 100a may include first to thirty-sixth pads 1 to 36.

The first pad 1 may be a candidate pad that may be attached to an external device and may output the internal state information IS. That is, the first pad 1 may be included in the third logic pad 123 (or the third logic pads 123) of FIG. 1. The second pad 2 may be attached to the external device and may receive the first boot voltage SWA_BOOT. The second pad 2 may correspond to (or may be identical to) the third regulation pad 142 of FIG. 1.

The third pad 3 may be attached to the external device and may receive the second input voltage VIN_Bulk. The third pad 3 may be included in the first regulation pads 131. The fourth pad 4 may be attached to the external device and may output the first switching voltage SWA. The fourth pad 4 may correspond to the second regulation pad 141 of FIG. 1.

The fifth pad 5 may be attached to the external device and may receive a first ground voltage PGND. The fifth pad 5 is not illustrated in FIG. 1. The sixth pad 6 may be attached to the external device and may output the second switching voltage SWB. The sixth pad 6 may correspond to the fifth regulation pad 151 of FIG. 1.

The seventh pad 7 may be attached to the external device and may receive the second input voltage VIN_Bulk. The seventh pad 7 may be included in the first regulation pads 131. The eighth pad 8 may be attached to the external device and may receive the second boot voltage SWB_BOOT. The eighth pad 8 may correspond to the sixth regulation pad 152 of FIG. 1.

The ninth pad 9 may be a candidate pad that may be attached to the external device and may output the internal state information IS. That is, the ninth pad 9 may be included in the third logic pad 123 (or the third logic pads 123) of FIG. 1. The tenth pad 10 may be a candidate pad that may be attached to the external device and may output the internal state information IS. That is, the tenth pad 10 may be included in the third logic pad 123 (or the third logic pads 123) of FIG. 1.

The eleventh pad 11 may be attached to the external device and may receive a second positive feedback voltage SWB_FB_P. The eleventh pad 11 is not illustrated in FIG. 1. The twelfth pad 12 may be attached to the external device and may receive the first input voltage VIN_mgmt. The twelfth pad 12 may correspond to the first LDO pad 111 of FIG. 1.

The thirteenth pad 13 may be attached to the external device and may receive a fourth negative feedback voltage SWD_FB_N/PID. The thirteenth pad 13 is not illustrated in FIG. 1. The fourteenth pad 14 may be attached to the external device and may receive a fourth positive feedback voltage SWD_FB_P. The fourth positive feedback voltage SWD_FB_P may correspond to (e.g., may be identical to) the fourth feedback voltage SWD_FB of FIG. 1, and the fourteenth pad 14 may be included in the tenth regulation pads 172 of FIG. 1.

The fifteenth pad 15 may be attached to the external device and may receive a bias voltage Vbias. The fifteenth pad 15 is not illustrated in FIG. 1. The sixteenth pad 16 may be attached to the external device and may receive a second ground voltage AGND. The sixteenth pad 16 is not illustrated in FIG. 1.

The seventeenth pad 17 may be attached to the external device and may output the second output voltage VOUT_1.8V. The seventeenth pad 17 may correspond to the third LDO pad 113 of FIG. 1. The eighteenth pad 18 may be attached to the external device and may output the first output voltage VOUT_1.1V. The eighteenth pad 18 may correspond to the second LDO pad 112 of FIG. 1.

The nineteenth pad 19 may be a candidate pad that may be attached to the external device and may output the internal state information IS. That is, the nineteenth pad 19 may be included in the third logic pad 123 (or the third logic pads 123) of FIG. 1. The twentieth pad 20 may be attached to the external device and may receive the fourth boot voltage SWD_BOOT. The twentieth pad 20 may correspond to the tenth regulation pads 172 of FIG. 1.

The twenty-first pad 21 may be attached to the external device and may receive the second input voltage VIN_Bulk. The twenty-first pad 21 may be included in the first regulation pads 131 of FIG. 1. The twenty-second pad 22 may be attached to the external device and may output the fourth switching voltage SWD. The twenty-second pad 22 may correspond to the ninth regulation pad 171 of FIG. 1.

The twenty-third pad (e.g., 23) may correspond to the same location as the location of the fifth pad 5, and thus may be omitted. The twenty-fourth pad 24 may be attached to the external device and may output the third switching voltage SWC. The twenty-fourth pad 24 may correspond to the seventh regulation pad 161 of FIG. 1.

The twenty-fifth pad 25 may be attached to the external device and may receive the second input voltage VIN_Bulk. The twenty-fifth pad 25 may be included in the first regulation pads 131 of FIG. 1. The twenty-sixth pad 26 may be attached to the external device and may receive the third boot voltage SWC_BOOT. The twenty-sixth pad 26 may be included in the eighth regulation pads 162 of FIG. 1.

The twenty-seventh pad 27 may be a candidate pad that may be attached to the external device and may output the internal state information IS. That is, the twenty-seventh pad 27 may be included in the third logic pad 123 (or the third logic pads 123) of FIG. 1. The twenty-eighth pad 28 may be a candidate pad that may be attached to the external device and may output the internal state information IS. That is, the twenty-eighth pad 28 may be included in the third logic pad 123 (or the third logic pads 123) of FIG. 1.

The twenty-ninth pad 29 may be attached to the external device and may receive the clock signal SCL. The twenty-ninth pad 29 may correspond to the second communication pad 182 of FIG. 1. The thirtieth pad 30 may be attached to the external device and may receive the data signal SDA. The thirtieth pad 30 may correspond to the first communication pad 181 of FIG. 1.

The thirty-first pad 31 may be attached to the external device and may output the general-purpose state interrupt signal GSI_n. The thirty-first pad 31 may correspond to the second logic pad 122 of FIG. 1. The thirty-second pad 32 may be attached to the external device and may receive a third negative feedback voltage SWC_FB_N. The thirty-second pad 32 is not illustrated in FIG. 1.

The thirty-third pad 33 may be attached to the external device and may receive a third positive feedback voltage SWC_FB_P. The third positive feedback voltage SWC_FB_P may correspond to the third feedback voltage SWC_FB of FIG. 1, and the thirty-third pad 33 may be included in the eighth regulation pad 162 of FIG. 1.

The thirty-fourth pad 34 may be attached to the external device and may receive a first positive feedback voltage SWAB_FB_P. The first positive feedback voltage SWAB_FB_P may correspond to the first feedback voltage SWAB_FB (also referred to as the "second feedback voltage SWAB_FB") of FIG. 1, and the thirty-fourth pad 34 may be included in the fourth regulation pad 149 of FIG. 1.

The thirty-fifth pad 35 may be attached to the external device and may receive a first negative feedback voltage SWAB_FB_N. The thirty-fifth pad 35 is not illustrated in FIG. 1. The thirty-sixth pad 36 may be attached to the external device and may output the state signal PWR_GOOD. The thirty-sixth pad 36 may correspond to the first logic pad 121 of FIG. 1.

Figure 5:
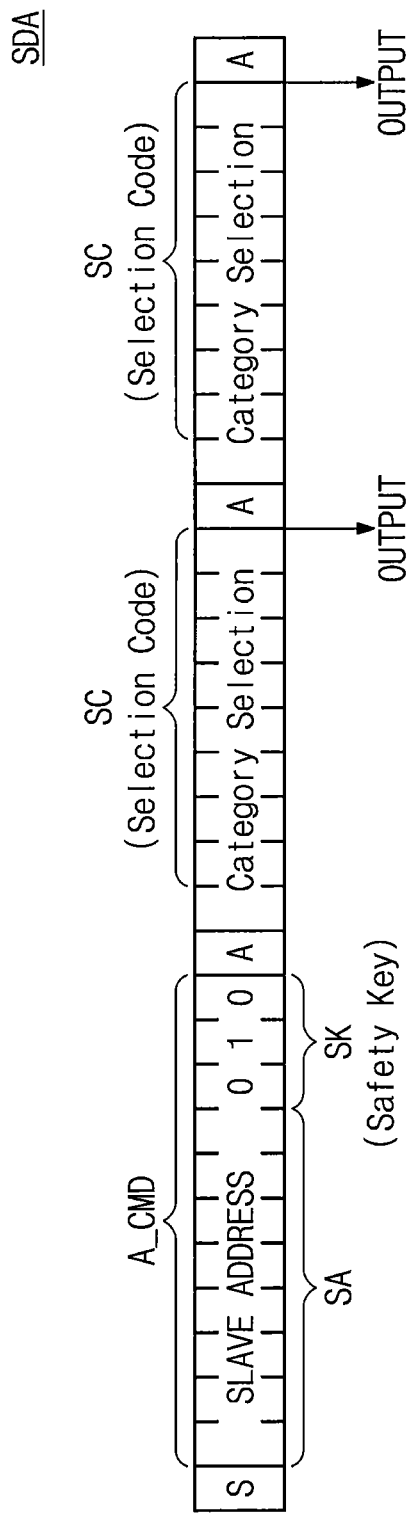
FIG. 5 illustrates an example of a data signal input to a power management integrated circuit according to embodiments of the inventive concepts.

FIG. 5 illustrates an example of the data signal SDA input to the power management integrated circuit 100 according to embodiments of the inventive concepts. Referring to FIGS. 1 and 5, each bit of the data signal SDA may be received in synchronization with the clock signal SCL. The data signal SDA may be received in synchronization with one of a rising edge and a falling edge of the clock signal SCL (e.g., at a single data rate (SDR)) or may be received in synchronization with both the rising edge and the falling edge of the clock signal SCL (e.g., at a double data rate (DDR)).

A start bit "S" may be first received as the data signal SDA. The start bit "S" may have a pattern informing a start of the data signal SDA in the I2C and/or I3C protocol.

Following the start bit "S", a slave address SA may be received as the data signal SDA. The slave address SA may have a pattern that is different from a meaningful pattern defined in the I2C and/or I3C protocol. For example, the slave address SA may have a pattern that is not part of the I2C and/or I3C protocol and may be, for example, a vendor-specific pattern. The slave address SA may have a pattern indicating the power management integrated circuit 100.

The pattern of the slave address SA may be embedded in the decoder 185 of the communication block 180 when the power management integrated circuit 100 is manufactured. When the slave address SA is received, the decoder 185 of the communication block 180 may be configured to determine that the data signal SDA is associated with an output of the internal state information IS of the power management integrated circuit 100.

Following the slave address SA, a safety key SK may be received as the data signal SDA. A predetermined pattern of the safety key SK may be embedded in the decoder 185 when the power management integrated circuit 100 is manufactured and/or may be otherwise predetermined by the decoder 185. For example, the predetermined safety key SK may have a pattern of "010" but the inventive concepts are not limited thereto. When the safety key SK received in the data signal SDA is different from the predetermined pattern of the safety key SK (e.g., a comparison of the received safety key SK does not match the predetermined pattern for the safety key SK), the decoder 185 may ignore the data signal SDA. When the safety key SK is matched with the predetermined pattern of the safety key SK, the decoder 185 may permit the output of the internal state information IS.

In the case where the slave address SA and the safety key SK are accurately input (e.g., the slave address SA indicates the power management integrated circuit 100 and the safety key SK matches the predetermined safety key pattern), the communication block 180 may permit the output of the internal state information IS. The communication block 180 may provide notification that the output of the internal state information IS is permitted, by outputting an acknowledge signal/value "A" as the data signal SDA. In the case where the output of the internal state information IS is not permitted, the communication block 180 may not output the acknowledge signal/value "A".

The slave address SA and the safety key SK may be considered as an authentication command A_CMD in that the output of the internal state information IS is permitted. Following the acknowledge signal/value "A", a selection code SC may be received as the data signal SDA. In the case where the output of the internal state information IS is permitted, the communication block 180 may provide the logic block 120 with the selection code SC or a code that is obtained by processing the selection code SC.

The selection code SC may select a category of the internal state information IS. For example, the logic block 120 may provide a plurality of internal state information as the internal state information IS to output-permitted candidates. The output-permitted candidates may be categories. The selection code SC may select a category through which the internal state information IS is to be output, from among the categories.

The logic block 120 may output the internal state information IS of the selected category through one of the third logic pads 123 and may output the acknowledge signal/value "A" as the data signal SDA. When another selection code SC is received as the data signal SDA, the logic block 120 may output the internal state information IS of another selected category through another of the third logic pads 123 and may output the acknowledge "A" as the data signal SDA.

For example, the third logic pads 123 through which the internal state information IS is output may be of a fixed designation type or an address designation type.

As an example of the fixed designation type, there may be designated a pad (e.g., when the power management integrated circuit 100 is manufactured or otherwise predetermined), which outputs the internal state information IS corresponding to a k-th selection code SC, from among the third logic pads 123. The power management integrated circuit 100 may output the internal state information IS corresponding to the k-th selection code SC always through the same pad of the third logic pads 123.

As an example of the address designation type, addresses may be designated to the third logic pads 123 (e.g., when the power management integrated circuit 100 is manufactured or otherwise predetermined). The selection code SC may be input together with an address of a pad, through which there is output a selected category, from among the third logic pads 123. The logic block 120 may output the internal state information IS of a category selected by the selection code SC through a pad selected by the address of the selection code SC. In some embodiments, the selection code SC may indicate both a category of internal state information IS to be output and a designated address (e.g., a specific pad) at which the internal state information IS is to be output.

Figure 6:
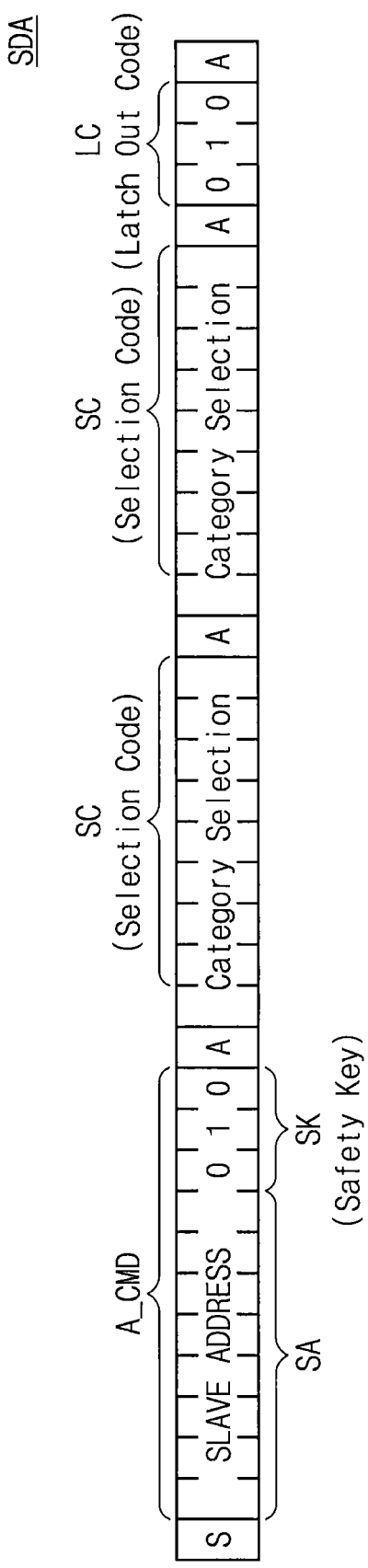
FIG. 6 illustrates an example in which a latch out code is added to the data signal of FIG. 5.

FIG. 6 illustrates an example in which a latch out code LC is added to the data signal SDA of FIG. 5. Referring to FIGS. 1 and 6, the power management integrated circuit 100 may further receive the latch out code LC as the data signal SDA. The latch out code LC may have, for example, a pattern of "0101" though the inventive concepts are not limited thereto.

The communication block 180 may transfer the latch out code LC (or a code obtained by processing the latch out code LC) to the logic block 120. When the latch out code LC is received, the logic block 120 may identify that the selection code SC is completely input.

For example, as described with reference to FIG. 5, the logic block 120 may output the internal state information IS in response to the input of the selection code SC. When the latch out code LC is input, the logic block 120 may maintain the outputting of the internal state information IS (or may continue to output the internal state information IS).

For another example, the logic block 120 may identify a category in response to the input of the selection code SC. The logic block 120 may output the internal state information IS of a selected category (or selected categories) in response to the input of the latch out code LC.

Figure 7:
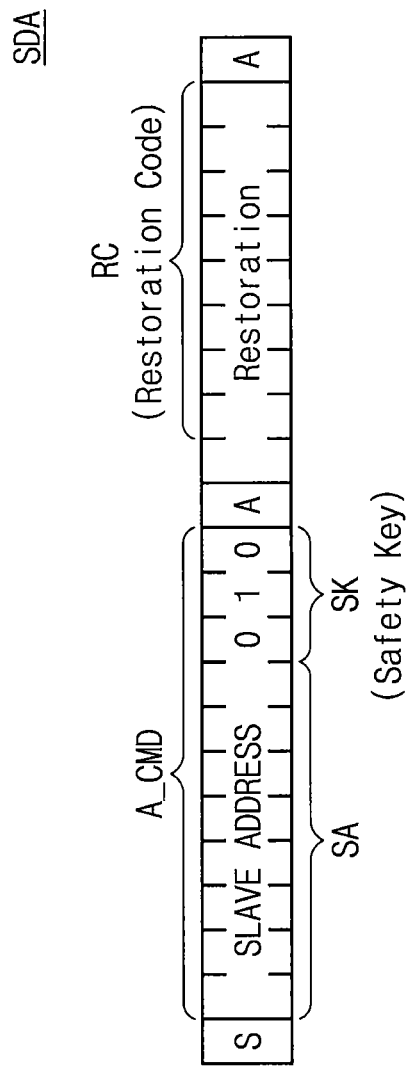
FIG. 7 illustrates an example of a data signal for terminating an output of internal state information according to embodiments of the inventive concepts.

FIG. 7 illustrates an example of the data signal SDA for terminating an output of the internal state information IS. Referring to FIG. 7, the power management integrated circuit 100 may perform authentication by receiving the start bit "S", the slave address SA, and the safety key SK and transferring the acknowledge "A". In the case where the authentication is completed, a restoration code RC may be received as the data signal SDA.

The communication block 180 may transfer the restoration code RC (or a code obtained by processing the restoration code RC) to the logic block 120. In response to the restoration code RC, the switch 125 of the logic block 120 may terminate (or stop) outputting the internal state information IS. After the output of the internal state information IS is stopped, the power management integrated circuit 100 may transfer the acknowledge "A" as the data signal SDA.

In an embodiment, the process of receiving the start bit "S" and the authentication command A_CMD before the restoration code RC is input may be omitted. That is, as described with reference to FIGS. 5 and 6, the restoration code RC may be received after the data signal SDA is exchanged. For example, a signal or a code that is not associated with the internal state information IS may be prohibited from being exchanged through the first communication pad 181, until the restoration code RC is input after the authentication is performed through the authentication command A_CMD.

Figure 8:
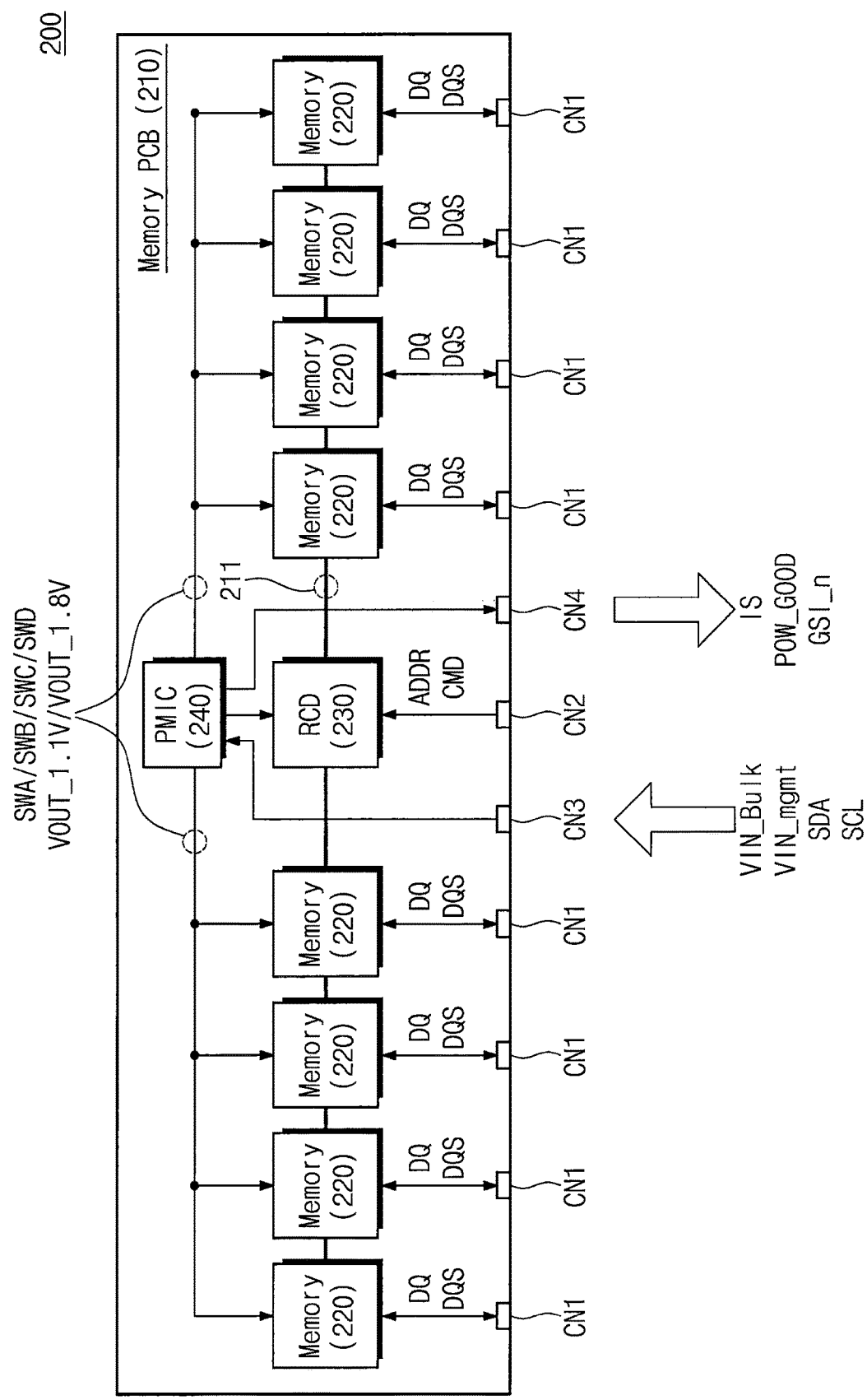
FIG. 8 is a block diagram illustrating a semiconductor memory module including a power management integrated circuit according to an embodiment of the inventive concepts.

FIG. 8 is a block diagram illustrating a semiconductor memory module 200 including a power management integrated circuit 240 according to an embodiment of the inventive concepts. Referring to FIG. 8, the semiconductor memory module 200 may include a memory printed circuit board (PCB) 210, memory devices 220, a register clock driver (RCD) 230, and the power management integrated circuit (PMIC) 240.

The memory PCB 210 may function as a body of a semiconductor memory module. The memory devices 220 may be mounted on the memory PCB 210. The memory devices 220 may include a dynamic random access memory (DRAM), a phase-change RAM (PRAM), a ferroelectric RAM (FRAM), a magnetic RAM (MRAM), a resistive RAM (RRAM), and/or a flash memory, although these are merely examples and the present inventive concepts are not limited thereto.

The memory devices 220 may be connected to first connectors CN1 through wires on the memory PCB 210. The first connectors CN1 may include, for example, gold fingers of a dual in-line memory module (DIMM). The memory devices 220 may exchange data DQ and a data strobe signal DQS with an external device through the first connectors CN1.

The register clock driver 230 may be mounted on the memory PCB 210. The register clock driver 230 may be connected to a second connector CN2 through wires on the memory PCB 210. The second connector CN2 may include, for example, gold fingers of the DIMM. The register clock driver 230 may receive an address ADDR and a command CMD from the external device through the second connector CN2.

The register clock driver 230 may further receive various signals from the external device through the second connector CN2. The register clock driver 230 may transfer the address ADDR, the command CMD, and/or the various signals to the memory devices 220 through wires 211 on the memory PCB 210. For example, the register clock driver 230 may transfer the address ADDR, the command CMD, and the various signals to the memory devices 220 in common and at the same time.

The power management integrated circuit 240 may be mounted on the memory PCB 210. The power management integrated circuit 240 may be connected to a third connector CN3 and a fourth connector CN4 through wires on the memory PCB 210. The third connector CN3 and the fourth connector CN4 may include, for example, gold fingers of the DIMM. The power management integrated circuit 240 may include the power management integrated circuit 100 described with reference to FIGS. 1 to 7.

The power management integrated circuit 240 may receive the first input voltage VIN_mgmt, the second input voltage VIN_Bulk, and the clock signal SCL from the external device through the third connector CN3. The signals are illustrated by a unidirectional arrow in FIG. 8, but the power management integrated circuit 240 may exchange the data signal SDA with the external device bidirectionally through the third connector CN3.

The power management integrated circuit 240 may generate and output the first output voltage VOUT_1.1V, the second output voltage VOUT_1.8V, the first switching voltage SWA, the second switching voltage SWB, the third switching voltage SWC, and the fourth switching voltage SWD from the first input voltage VIN_mgmt and the second input voltage VIN_Bulk.

Each of the first output voltage VOUT_1.1V, the second output voltage VOUT_1.8V, the first switching voltage SWA, the second switching voltage SWB, the third switching voltage SWC, and the fourth switching voltage SWD may be supplied to an appropriate target of the memory devices 220 and the register clock driver 230.

The power management integrated circuit 240 may output the internal state information IS, the state signal PWR_GOOD, and the general-purpose state interrupt signal GSI_n to the external device through the fourth connector CN4.

In some embodiments, the semiconductor memory module 200 of FIG. 8 may be a registered DIMM (RDIMM). As illustrated in FIG. 8, the semiconductor memory module 200 may be configured to output the internal state information IS of the power management integrated circuit 240 through the fourth connector CN4. Accordingly, the power management integrated circuit 240 may provide a mounted debugging circuit on the semiconductor memory module 200 and may markedly reduce consumption of resources for debugging.

In an embodiment, a plurality of semiconductor memory modules may be inserted into one device (e.g., a test device). Power management integrated circuits of the plurality of semiconductor memory modules may be debugged simultaneously or individually. For example, the slave address SA (refer to FIGS. 5 to 7) may indicate all the power management integrated circuits or may identify each of the power management integrated circuits. The power management integrated circuits of the plurality of semiconductor memory modules may be debugged simultaneously or individually, based on the slave address SA.

A semiconductor memory module based on the RDIMM is described with reference to FIG. 8. However, the semiconductor memory module 200 may be applied as an unbuffered DIMM (UDIMM) by removing the register clock driver 230 from the semiconductor memory module 200. In this case, the address ADDR, the command CMD, and various control signals may be directly transferred from the second connector CN2 to the memory devices 220 through wires on the memory PCB 210.

A description is given with reference to FIG. 8 as the semiconductor memory module 200 including eight memory devices 220. However, the number of memory devices 220 included in the semiconductor memory module 200 is not limited to eight, and the semiconductor memory module 200 may include larger or smaller numbers of memory devices 220 than eight.

Figure 9:
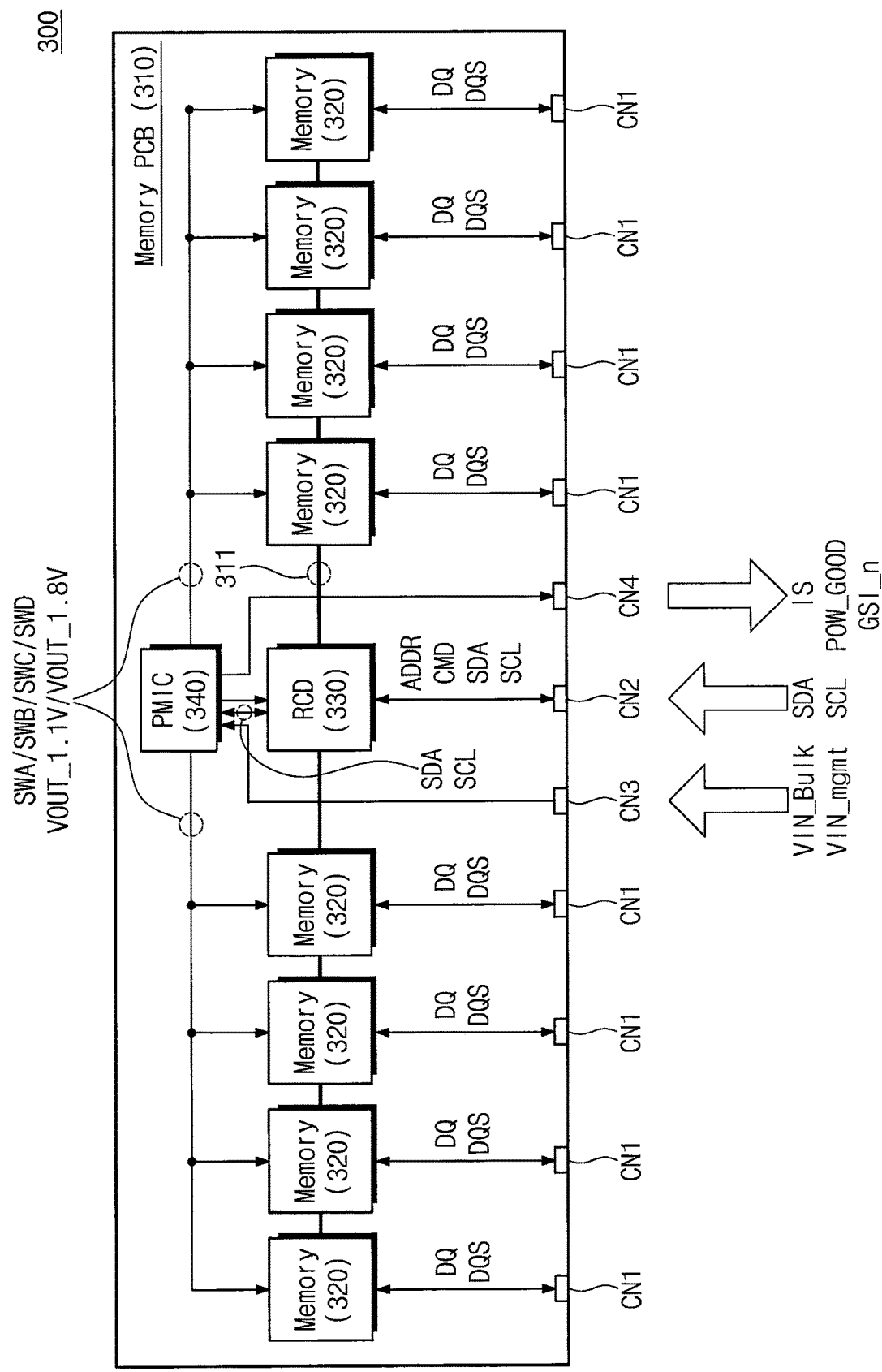
FIG. 9 illustrates a semiconductor memory module according to another embodiment of the inventive concepts.

FIG. 9 illustrates a semiconductor memory module 300 according to another embodiment of the inventive concepts. Referring to FIG. 9, the semiconductor memory module 300 may include a memory PCB 310, memory devices 320, a register clock driver 330, and a power management integrated circuit 340. The register clock driver 330 may be connected in common with the memory devices 320 through wires 311. The power management integrated circuit 340 may include the power management integrated circuit 100 described with reference to FIGS. 1 to 7.

A configuration and an operation of the semiconductor memory module 300 may be similar to those of the semiconductor memory module 200 described with reference to FIG. 8. Thus, additional description will be omitted to avoid redundancy. For example, among the components and the operations described with reference to the semiconductor memory module 200 of FIG. 8, components and operations that are not explicitly differently described with reference to the semiconductor memory module 300 of FIG. 9 may be identical to those described with reference to the semiconductor memory module 200 of FIG. 8.

Compared to FIG. 8, the power management integrated circuit 340 illustrated in FIG. 9 may receive the first input voltage VIN_mgmt and the second input voltage VIN_Bulk through the third connector CN3 from the external device. The register clock driver 330 may further include the data signal SDA and the clock signal SCL through the second connector CN2 from the external device, in addition to the address ADDR, the command CMD, and various signals.

The register clock driver 330 may exchange the data signal SDA and the clock signal SCL with the power management integrated circuit 340 through separate wires on the memory PCB 310. For example, the register clock driver 330 and the power management integrated circuit 340 may be connected in the form of a chain to exchange the data signal SDA with the external device through the second connector CN2 and to receive the clock signal SCL from the external device through the second connector CN2.

When the authentication command A_CMD (refer to FIGS. 5 to 7) is accurately input, the register clock driver 330 may ignore the authentication command A_CMD. The power management integrated circuit 340 may permit an output of the internal state information IS in response to the authentication command A_CMD, as described with reference to FIGS. 1 to 7.

When the selection code SC, the latch out code LC, and/or the restoration code RC is input, the register clock driver 330 may ignore the selection code SC, the latch out code LC, and/or the restoration code RC. The power management integrated circuit 340 may perform an appropriate operation in response to the selection code SC, the latch out code LC, and/or the restoration code RC, as described with reference to FIGS. 1 to 7.

As described with reference to FIG. 8, a plurality of semiconductor memory modules may be inserted into a test device and may be debugged simultaneously or individually. As described with reference to FIG. 8, the semiconductor memory module 300 of FIG. 9 may be an RDIMM but may be changed (or modified) to be an UDIMM.

In the description is given with reference to FIG. 9, the power management integrated circuit 340 outputs the internal state information IS to the external device through wires on the memory PCB 310 and the fourth connector CN4. However, the power management integrated circuit 340 may alternatively or additionally transfer the internal state information IS to the register clock driver 330. The register clock driver 330 may transfer the internal state information IS to the external device through the second connector CN2.

Figure 10:
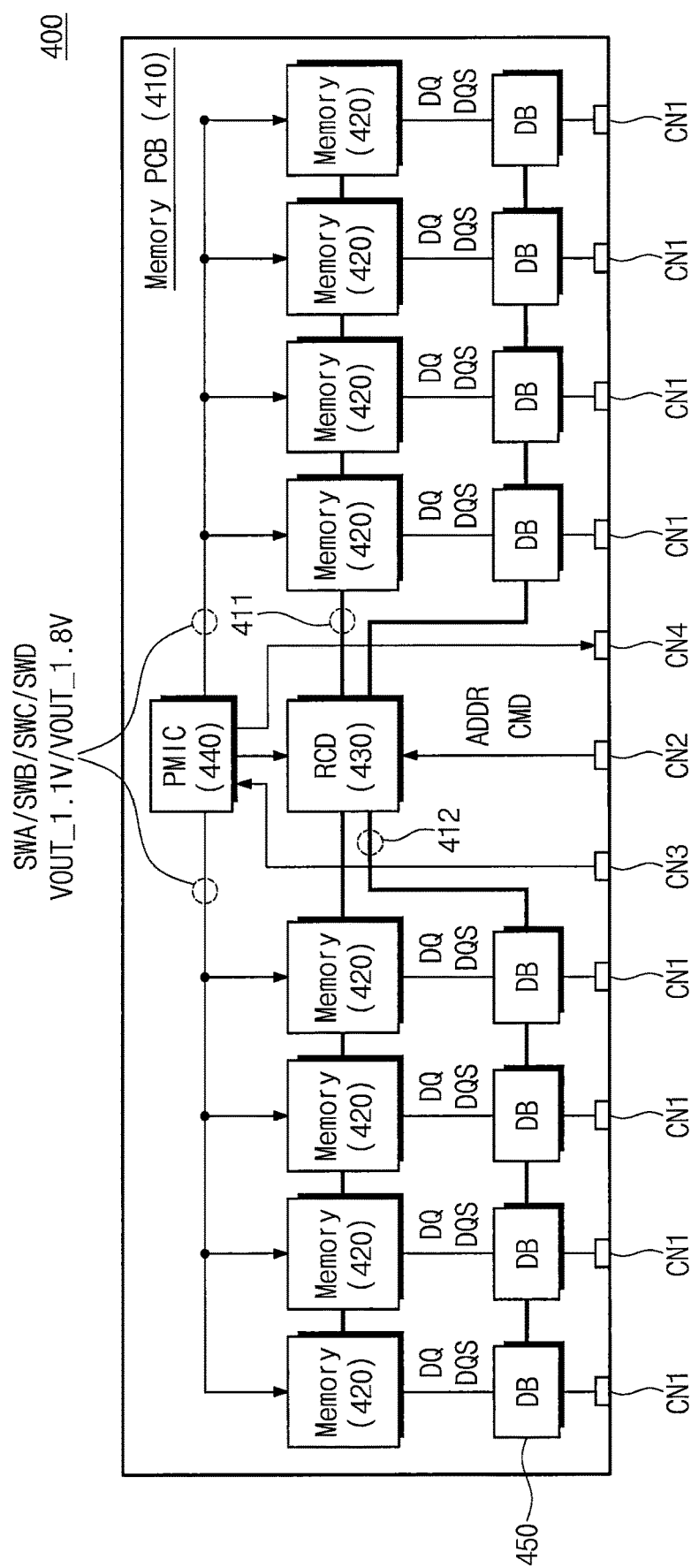
FIG. 10 illustrates a semiconductor memory module according to another embodiment of the inventive concepts.

FIG. 10 is a diagram illustrating a semiconductor memory module 400 according to another embodiment of the inventive concepts. Referring to FIG. 10, the semiconductor memory module 400 may include a memory PCB 410, memory devices 420, a register clock driver 430, a power management integrated circuit 440, and data buffers (DB) 450.

Compared to the semiconductor memory module 200 of FIG. 8 or the semiconductor memory module 300 of FIG. 9, the power management integrated circuit 440 may be configured to control the memory devices 420 through first wires 411 and to control the data buffers 450 through second wires 412. The power management integrated circuit 440 may include the power management integrated circuit 100 described with reference to FIGS. 1 to 7.

The memory devices 420 may correspond to the data buffers 450, respectively. The memory devices 420 may be connected to the first connectors CN1 through the data buffers 450.

A configuration and an operation of the semiconductor memory module 400 may be similar to those of the semiconductor memory module 200 described with reference to FIG. 8 or the semiconductor memory module 300 described with reference to FIG. 9. Thus, additional description will be omitted to avoid redundancy. For example, among the components and the operations described with reference to the semiconductor memory module 200 of FIG. 8 or the semiconductor memory module 300 of FIG. 9, components and operations that are not explicitly differently described with reference to the semiconductor memory module 400 of FIG. 10 may be identical to those described with reference to the semiconductor memory module 200 of FIG. 8 or the semiconductor memory module 400 of FIG. 9.

The semiconductor memory module 400 of FIG. 10 may be a load reduced DIMM (LRDIMM). As described with reference to FIG. 8, the power management integrated circuit 440 may be configured to receive the data signal SDA and the clock signal SCL from the external device through the third connector CN3.

Alternatively, as described with reference to FIG. 9, the power management integrated circuit 440 may be configured to receive the data signal SDA and the clock signal SCL from the register clock driver 430. Also, as described with reference to FIG. 8, a plurality of semiconductor memory modules may be inserted into a test device and may be debugged simultaneously or individually.

Figure 11:
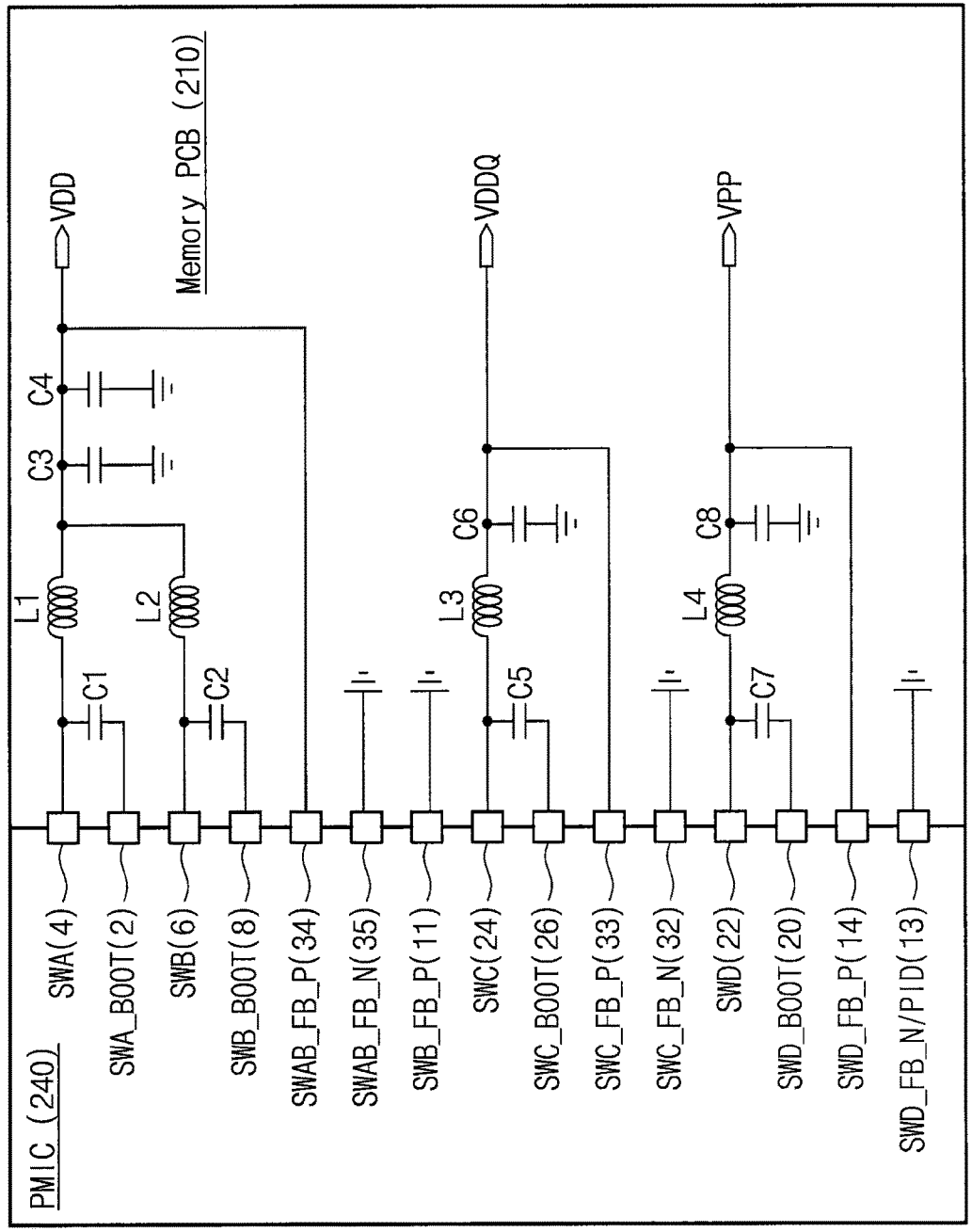
FIG. 11 illustrates an example in which the power management integrated circuit of FIG. 8 is connected with a memory PCB.

FIG. 11 illustrates an example in which the power management integrated circuit 240 of FIG. 8 is connected with the memory PCB 210. Referring to FIGS. 4 and 11, a first capacitor C1 may be connected between the fourth pad 4 and the second pad 2. The first switching voltage SWA may be input as the first boot voltage SWA_BOOT through the first capacitor C1.

A second capacitor C2 may be connected between the sixth pad 6 and the eighth pad 8. The second switching voltage SWB may be input as the second boot voltage SWB_BOOT through the second capacitor C2.

The fourth pad 4 may be connected with a first node, from which a first voltage VDD is output, through a first inductor L1. The first inductor L1 may have, for example, an inductance of 0.68 μH to 1.1 μH. The sixth pad 6 may be connected with the first node, from which the first voltage VDD is output, through a second inductor L2. The second inductor L2 may have, for example, an inductance of 0.68 μH to 1.1 μH.

A third capacitor C3 and a fourth capacitor C4 may be connected with the first node from which the first voltage VDD is output. The third capacitor C3 and the fourth capacitor C4 may have, for example, a total capacitance of 500 μF.

The first switching voltage SWA and the second switching voltage SWB may be output as the first voltage VDD through the first capacitor C1, the second capacitor C2, the first inductor L1, the second inductor L2, the third capacitor C3, and the fourth capacitor C4. The first voltage VDD may be 1.0 V.

The first capacitor C1, the second capacitor C2, the first inductor L1, the second inductor L2, the third capacitor C3, and the fourth capacitor C4 may be mounted on the memory PCB 210. The first voltage VDD may be input as the first positive feedback voltage SWAB_FB_P through the thirty-fourth pad 34.

A ground voltage may be input to the thirty-fifth pad 35 as the first negative feedback voltage SWAB_FB_N. The ground voltage may be input to the eleventh pad 11 as the second positive feedback voltage SWB_FB_P.

A fifth capacitor C5 may be connected between the twenty-fourth pad 24 and the twenty-sixth pad 26. The third switching voltage SWC may be input as the third boot voltage SWC_BOOT. The twenty-fourth pad 24 is connected with a second node, from which a second voltage VDDQ is output, through a third inductor L3. The third inductor L3 may have, for example, an inductance of 0.68 μH to 1.1 μH.

A sixth capacitor C6 may be connected with the second node from which the second voltage VDDQ is output. The sixth capacitor C6 may have, for example, a capacitance of 250 μF. The third switching voltage SWC may be output as the second voltage VDDQ through the fifth capacitor C5, the third inductor L3, and the sixth capacitor C6. The second voltage VDDQ may be 1.1 V. The fifth capacitor C5, the third inductor L3, and the sixth capacitor C6 may be mounted on the memory PCB 210.

The second voltage VDDQ may be input to the thirty-third pad 33 as the third positive feedback voltage SWC_FB_P. The ground voltage may be input to the thirty-second pad 32 as the third negative feedback voltage SWC_FB_N.

A seventh capacitor C7 may be connected between the twenty-second pad 22 and the twentieth pad 20. The fourth switching voltage SWD may be input as the fourth boot voltage SWD_BOOT. The twenty-second pad 22 is connected with a third node, from which a third voltage VPP is output, through a fourth inductor L4. The fourth inductor L4 may have, for example, an inductance of 0.68 μH to 1.1 μH.

An eighth capacitor C8 may be connected with the third node from which the third voltage VPP is output. The eighth capacitor C8 may have, for example, a capacitance of 250 μF. The fourth switching voltage SWD may be output as the third voltage VPP through the seventh capacitor C7, the fourth inductor L4, and the eighth capacitor C8. The third voltage VPP may be 1.8 V. The seventh capacitor C7, the fourth inductor L4, and the eighth capacitor C8 may be mounted on the memory PCB 210.

The third voltage VPP may be input to the fourteenth pad 14 as the fourth positive feedback voltage SWD_FB_P. The ground voltage may be input to the thirteenth pad 13 as the fourth negative feedback voltage SWD_FB_N.

The semiconductor memory modules 200, 300, and 400 are described in the above embodiments. For example, the semiconductor memory modules 200, 300, and 400 may be configured to communicate with the external device in compliance with the DDR5 DIMM protocol. Also, the semiconductor memory modules 200, 300, and 400 may be changed or modified to have structures complying with various standards that are derived from DIMMs such as an UDIMM, an RDIMM, and an LRDIMM.

In the above embodiments, a description is given as the power management integrated circuits 100, 240, 340, and 440 exchange signals with the external device by using pads. However, the "pad" may be replaced with any other equivalent component, which may be used to attach one semiconductor package to a PCB, such as a "pin," a "ball," or a "slot." However, the inventive concepts are not limited by the term "pad."

As described above, components of the power management integrated circuit 100 and the semiconductor memory modules 200, 300, and 400 are described above by using the terms "first," "second,", "third," and the like. However, the terms "first," "second," "third," and the like may be used to distinguish components from each other and do not limit the inventive concepts. For example, the terms "first," "second," "third," and the like do not involve an order or a numerical meaning of any form.

In the above embodiments, components according to embodiments of the inventive concepts are described by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits and/or intellectual property (IP) implemented with semiconductor elements in an integrated circuit.

According to the inventive concepts, a power management integrated circuit outputs an internal parameter to the outside (e.g., to an external system) responsive to a particular command that is received through a communication block. Accordingly, there is provided a power management integrated circuit providing a useful circuit for debugging.

While the inventive concepts have been described with reference to example embodiments thereof, it will be apparent to those of ordinary skill in the art that various changes and modifications may be made thereto without departing from the scope of the inventive concepts as set forth in the following claims.

What is claimed is:

1. A power management integrated circuit comprising:
   first pads, second pads, a third pad, and a fourth pad configured to be connected with an external device;
   a regulation block configured to receive first voltages from the first pads, to convert the first voltages to second voltages, and to output the second voltages to the second pads;
   a communication block configured to receive a command through the third pad and to output an internal information request received together with the command responsive to the command; and
   a logic block configured to control an operation of the regulation block, to receive the internal information request from the communication block, and to output internal state information to the fourth pad based on the internal information request.

2. The power management integrated circuit of claim 1, wherein the internal state information comprises an internal voltage or current of the logic block.

3. The power management integrated circuit of claim 1, wherein the logic block comprises a memory, and
wherein the internal state information comprises an operating voltage of an operation of the memory.

4. The power management integrated circuit of claim 3, wherein the operating voltage comprises a multi-time program (MTP) voltage.

5. The power management integrated circuit of claim 1, wherein the communication block is further configured to communicate with the external device through the third pad in compliance with an Inter-Integrated Circuit (I2C) and/or Improved Inter-Integrated Circuit (I3C) protocol.

6. The power management integrated circuit of claim 5, wherein the communication block is further configured to output the internal information request received together with the command to the logic block responsive to the command having a predetermined format that differs from an I2C command of the I2C protocol and/or an I3C command of the I3C protocol.

7. The power management integrated circuit of claim 1, wherein the internal information request comprises a first selection code for selecting a first internal state information of a plurality of internal state information of the logic block, and
wherein the logic block is further configured to output the first internal state information selected by the first selection code from among the plurality of internal state information to the fourth pad as the internal state information.

8. The power management integrated circuit of claim 7, further comprising:
a fifth pad configured to be connected with the external device,
wherein the internal information request further comprises a second selection code for selecting a second internal state information of the plurality of internal state information of the logic block, and
wherein the logic block is further configured to output the second internal state information selected by the second selection code from among the plurality of internal state information to the fifth pad.

9. The power management integrated circuit of claim 7, wherein the internal information request further comprises a latch out code, and
wherein the logic block is further configured to continue outputting the internal state information to the fourth pad in response to the latch out code.

10. The power management integrated circuit of claim 1, wherein the fourth pad comprises two or more pads,
wherein the internal information request comprises two or more selection codes indicating two or more internal state information and a latch out code following the two or more selection codes,
wherein the logic block is further configured to output the two or more internal state information indicated by the two or more selection codes through the fourth pad in response to the latch out code, and
wherein the internal state information is included as one of the two or more internal state information.

11. The power management integrated circuit of claim 1, wherein the internal information request comprises a restoration code, and
wherein the logic block is further configured to terminate outputting the internal state information to the fourth pad in response to the restoration code.

12. A semiconductor memory module comprising:
a printed circuit board comprising first connectors, second connectors, and third connectors configured to communicate with an external device;
memory devices on the printed circuit board, and configured to exchange a data signal and a data strobe signal with the external device through the first connectors;
a driver on the printed circuit board, and configured to receive a first command and an address from the external device through the second connectors and to control the memory devices in response to the first command and the address; and
a power management integrated circuit on the printed circuit board, and configured to receive first voltages from the external device through the third connectors, to convert the first voltages to second voltages, and to supply the second voltages to the memory devices and the driver,
wherein the power management integrated circuit is further configured to output an internal voltage or current responsive to a second command from the external device.

13. The semiconductor memory module of claim 12, wherein the printed circuit board further comprises a fourth connector configured to communicate with the external device, and
wherein the second command is received through the fourth connector.

14. The semiconductor memory module of claim 12, wherein the printed circuit board further comprises a fourth connector configured to communicate with the external device, and
wherein the driver is further configured to transfer the second command received through the fourth connector to the power management integrated circuit.

15. The semiconductor memory module of claim 12, wherein the second command comprises a selection code, and
wherein the power management integrated circuit is further configured to select the internal voltage or current to output based on the selection code.

16. The semiconductor memory module of claim 12, wherein the printed circuit board further comprises fourth connectors configured to communicate with the external device,
wherein the power management integrated circuit is further configured to transfer the internal voltage or current to the driver, and
wherein the driver is further configured to output, through the fourth connectors, the internal voltage or current that is transferred from the power management integrated circuit.

17. The semiconductor memory module of claim 12, further comprising:
data buffers on the printed circuit board and corresponding to the memory devices, respectively,
wherein the memory devices are respectively connected with the first connectors through the data buffers.

18. The semiconductor memory module of claim 12, wherein the power management integrated circuit is further configured to communicate with the external device in compliance with an Inter-Integrated Circuit (I2C) or Improved Inter-Integrated Circuit (I3C) protocol through a designated pad, and wherein the second command is received through the designated pad and has a predetermined format that differs from an I2C command of the I2C protocol and/or an I3C command of the I3C protocol.

19. A power management integrated circuit comprising:

a first pad, a second pad, a third pad, a fourth pad, a fifth pad, a sixth pad, a seventh pad, an eighth pad, a ninth pad, a tenth pad, a data pad, and a clock pad configured to be connected with an external device;

a low drop out (LDO) regulator configured to receive a first voltage through the first pad, to generate an internal voltage, a second voltage, and a third voltage from the first voltage, and to output the second voltage and the third voltage through the second pad and the third pad, respectively;

a regulation block configured to receive the internal voltage from the LDO regulator, to operate by using the internal voltage, to receive a fourth voltage from the fourth pad, to generate a fifth voltage, a sixth voltage, a seventh voltage, and an eighth voltage from the fourth voltage, and to output the fifth voltage, the sixth voltage, the seventh voltage, and the eighth voltage through the fifth pad, the sixth pad, the seventh pad, and the eighth pad, respectively;

a communication block configured to communicate data through the data pad, to receive a clock signal through the clock pad, and to output, responsive to the data having a particular pattern, a selection code that is transferred through the data pad; and a logic block configured to control the regulation block and to output a signal indicating a state of the regulation block through the ninth pad, wherein, responsive to receiving the selection code from the communication block, the logic block is further configured to output through the tenth pad a voltage or current corresponding to the selection code from among internally used voltages or currents.

20. The power management integrated circuit of claim 19, wherein the logic block comprises a memory, and wherein the logic block is further configured to output a multi-time program (MTP) voltage used in the memory through the tenth pad.

* * * * *